(12) United States Patent
Kraus et al.

(10) Patent No.: US 6,791,479 B2
(45) Date of Patent: Sep. 14, 2004

(54) SYSTEM FOR LOGIC STATE DETECTION

(75) Inventors: Richard Alen Kraus, Farmington Hills, MI (US); Charles Thomas Clark, Redford, MI (US)

(73) Assignee: Visteon Global Technologies, Inc., Dearborn, MI (US)

(*) Notice: Subject to any disclaimer, the term of this patent is extended or adjusted under 35 U.S.C. 154(b) by 463 days.

(21) Appl. No.: 09/821,977

(22) Filed: Mar. 30, 2001

(65) Prior Publication Data

US 2002/0140434 A1 Oct. 3, 2002

(51) Int. Cl.[7] ............................................ H03K 17/693
(52) U.S. Cl. ........................ 341/26; 324/522; 340/518
(58) Field of Search ...................... 341/26, 22; 340/518, 340/644, 14.69; 324/522

(56) References Cited

U.S. PATENT DOCUMENTS

| 3,921,140 A | | 11/1975 | Houston et al. | |
|---|---|---|---|---|
| 4,484,180 A | | 11/1984 | Deforeit | |
| 4,906,993 A | | 3/1990 | Freeman et al. | |
| 5,036,320 A | | 7/1991 | Wroblewski | |
| 5,081,586 A | * | 1/1992 | Barthel et al. | 701/49 |
| 5,886,511 A | * | 3/1999 | Tuozzolo et al. | 323/274 |
| 6,058,343 A | * | 5/2000 | Orbach et al. | 701/50 |

OTHER PUBLICATIONS

US 2001/0045873 Suzuki et al., "Noise Reduction Circuit and Semiconductor Device Including The Same", p. 1.*

* cited by examiner

*Primary Examiner*—Michael Horabik
*Assistant Examiner*—Hung Dang
(74) *Attorney, Agent, or Firm*—Brinks Hofer Gilson & Lione

(57) ABSTRACT

A logic state detection system for detecting the state of at least one state changing device includes a scanning circuit and a current detection circuit. The scanning circuit selectively activates at least one output line electrically connected with the at least one state changing device. Current passes through the scanning circuit to the at least one output line that is activated. The current detection circuit determines whether the state changing device is in a conducting or a non-conducting state as a function of the current.

39 Claims, 9 Drawing Sheets

SYSTEM FOR LOGIC STATE DETECTION

BACKGROUND

1. Field of the Invention

This invention relates to logic state detection in electrical systems, and more particularly to sensing the electrical state of devices to provide an indication of the logical operating state of these devices.

2. Description of the Related Art

Sensing a change in electrical state is one of the fundamental operations in many logic based systems. Changes in electrical state may be a result of actuation of switches, energization of transistors, opening/closing of contacts or operation of other similar state changing devices capable of alternating between a conducting and a non-conducting state. In general, a data processor or other similar device senses changes in electrical state corresponding to changes between a "logic one" state and a "logic zero" state.

Typically, the state changing device is part of a discrete circuit electrically connected with an input to the data processor. In addition, the state changing device is supplied a wetting voltage from the data processor or a power supply. The wetting voltage is provided to each discrete circuit such that the data processor senses the wetting voltage when the state changing device is in the conducting state.

When the data processor is used to sense a large number of state changing devices, time division multiplexing may be used to limit the number of inputs to the data processor. Time division multiplexing involves electrically connecting the state changing devices in a matrix. Multiple discrete circuits are similarly electrically connected in columns and rows of the matrix. With time division multiplexing, the data processor monitors an input electrically connected with a row (or column) and a wetting voltage is supplied to each column (or row). As such, the data processor senses the wetting voltage and captures the electrical state of each of the state changing devices by sequentially cycling through the rows and columns of the matrix.

When large numbers of state changing devices are to be scanned by the data processor, the matrix is correspondingly increased in size. Increased size of the matrix requires larger numbers of inputs to be monitored by the data processor as well as additional wetting voltages and discrete components. In addition to the increased hardware, wiring and power supply requirements; the data processor also includes additional I/O (input/output) pins to monitor the additional inputs. Further, the size of the data processor and associated hardware is increased to accommodate the additional wiring and I/O pins.

BRIEF SUMMARY

The present invention is defined by the following claims, and nothing in this section should be taken as a limitation on those claims. By way of introduction, the embodiments described below include a method and system for detecting the logic state of at least one state changing device with a logic state detection system. The method and system allows large numbers of state changing devices to be efficiently scanned while minimizing the quantity of discrete components, the number of inputs to a data processor and the amount of hardware and wiring. The logic state detection system detects the logic state of state changing devices electrically connected with a ground connection. In another embodiment, the logic state of state changing devices electrically connected with a power supply may be determined.

The logic state detection system of one embodiment includes a scanning circuit, a data processor and a current detection circuit. The logic state detection system is directed by the data processor to setup and scan the state changing devices. An output line electrically connects one or more of the state changing devices with one of a plurality of output ports included in the scanning circuit.

Setup and scanning of the state changing devices occurs during a setup mode and a scanning mode. During the setup mode, the scanning circuit activates all of the output ports and the corresponding output lines. Current supplied from the current detection circuit flows through the scanning circuit and the output lines to initialize the scanning circuit. Initialization of the scanning circuit provides low current flow during the scan mode. Low current flow minimizes electromagnetic interference (EMI) and maximizes power efficiency.

During the scan mode, the data processor directs the scanning circuit to selectively activate the output ports and corresponding output lines. Selective activation of the output ports is accomplished by providing a serial data stream to the scanning circuit while enabling portions of the scanning circuit with an enabling signal. When activated, the output ports allow current to pass through the scanning circuit to the corresponding output lines. The current detection circuit monitors current flowing to the output lines. The current detection circuit, as a function of the current, identifies the logic state of the state changing device(s) electrically connected with an activated output line.

The logic state detection system is expandable to provide detection of any number of state changing devices without substantial increases in the number of I/O pins required from the data processor. In addition, the logic state detection system minimizes the use of discrete components and maximizes the scan density thereby providing a very compact and space efficient system. Further, by sourcing current supplied to the state changing devices out of the logic state detection system, external power supplies and associated wiring are minimized.

Further aspects and advantages of the invention are discussed below in conjunction with the preferred embodiments.

DETAILED DESCRIPTION OF THE PREFERRED EMBODIMENTS

Figure 1:
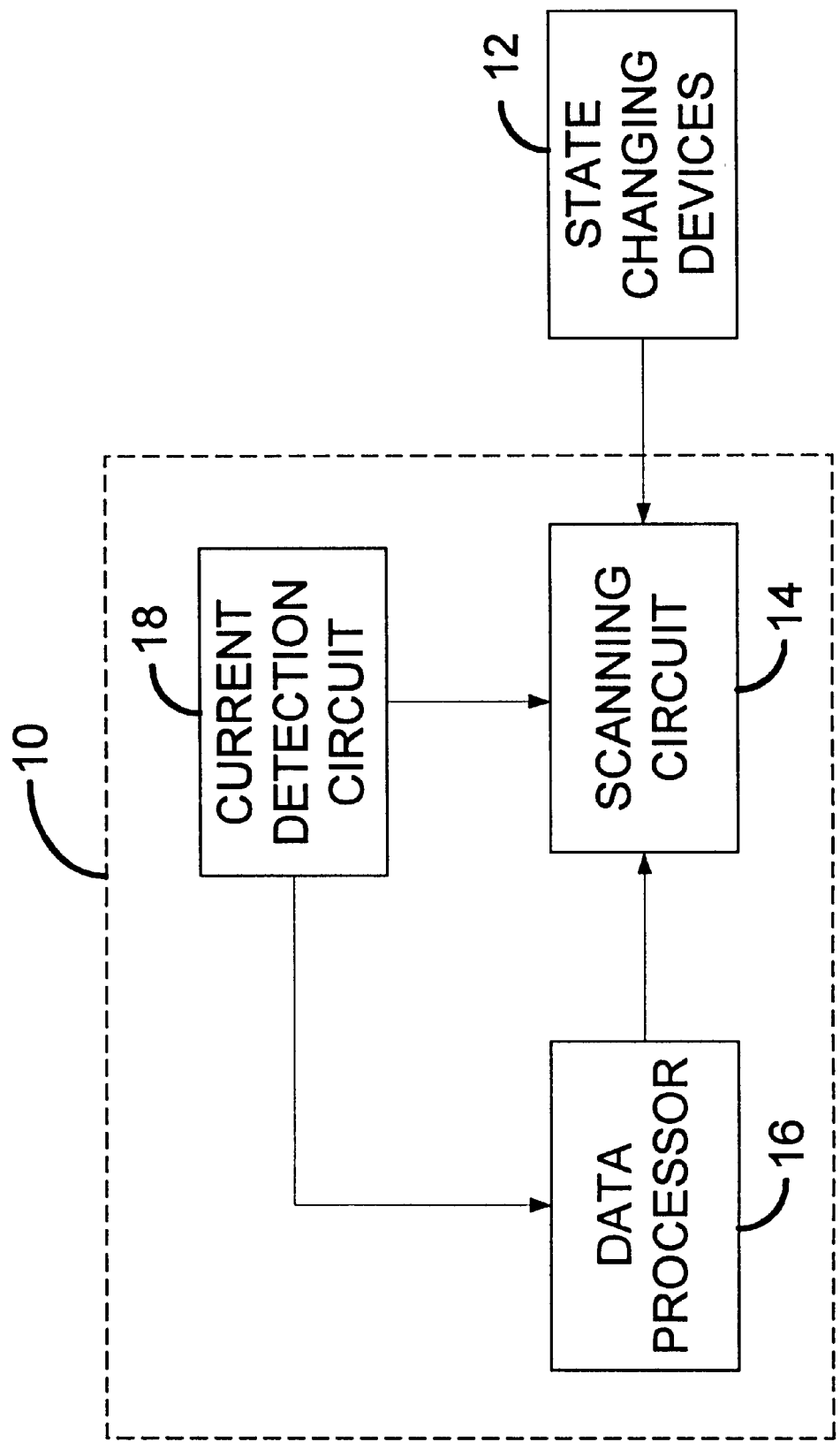
FIG. 1 is a block diagram of one embodiment of a logic state detection system and at least one state changing device.

FIG. 1 illustrates a block diagram of one embodiment of a logic state detection system 10 and at least one state changing device 12. The logic state detection system 10 includes a scanning circuit 14, a data processor 16 and a current detection circuit 18 electrically coupled as illustrated. The logic state detection system 10 provides a volume efficient system for detecting the logic state of a plurality of state changing devices 12.

The state changing devices 12 may be any type of devices capable of toggling between a conducting state (logic one) and a non-conducting state (logic zero). The state changing devices 12 are electrically coupled with the scanning circuit 14. The scanning circuit 14 selectively passes current to one or more of the state changing devices 12 as directed by the data processor 16. The current passing to the state changing devices 12 is monitored by the current detection circuit 18. The current detection circuit 18 provides signals indicative of the logic state of the state changing devices 12 to the data processor 16.

In one embodiment, the logic state detection system 10 is part of a human to machine interface system operating in a vehicle. The human to machine interface system serves as an electro-mechanical interface between an operator or passenger in the vehicle and the mechanisms and devices within the vehicle intended to supply function, convenience and safety. Communication between the operator or passengers and the mechanisms and devices in the vehicle is performed by the logic state detection system 10 using the state changing devices 12. For example, the logic state detection system 10 may sense the logic state of user set switches to activate and deactivate the devices and mechanisms within the vehicle.

Figure 2:
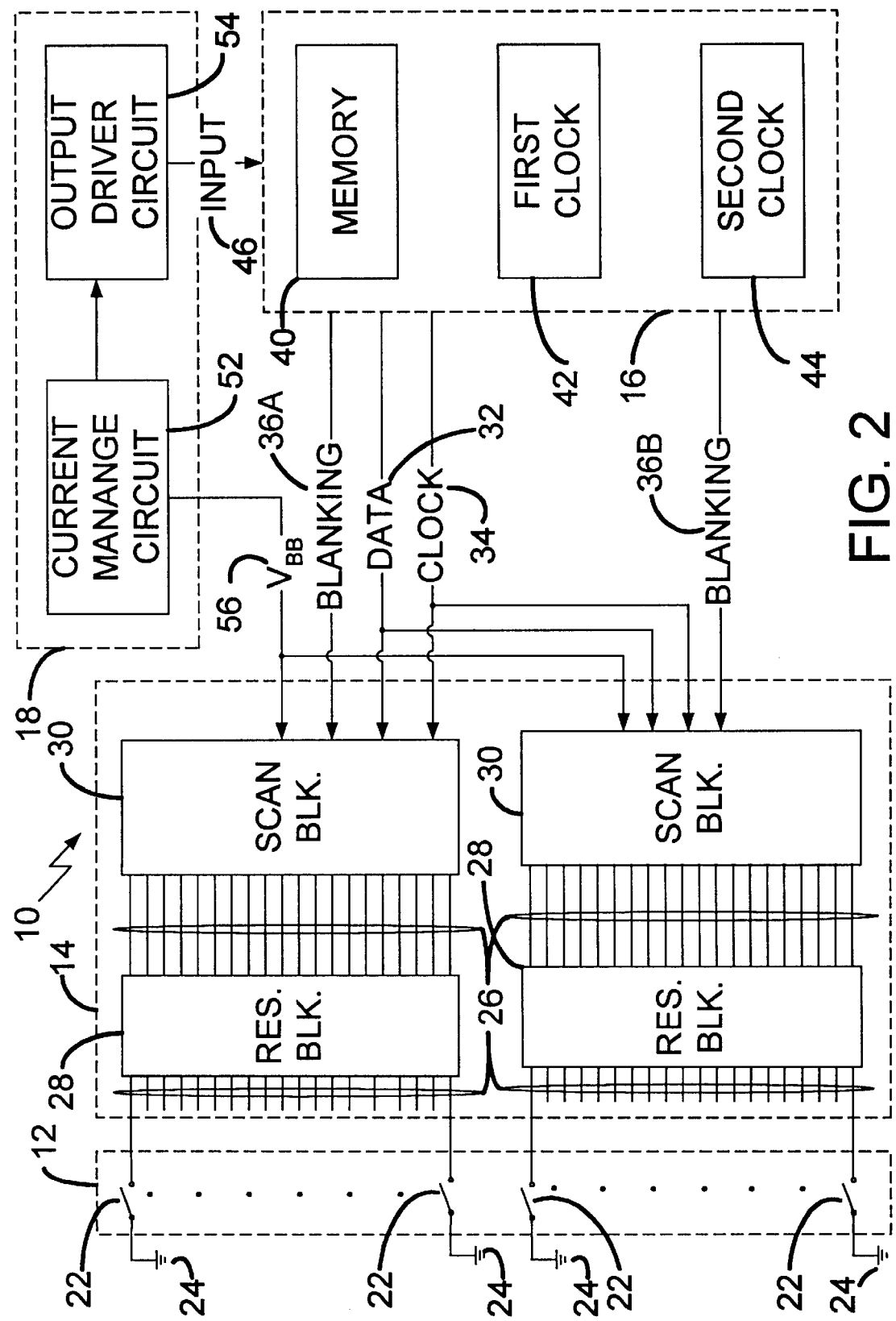
FIG. 2 is an expanded block diagram of one embodiment of the logic state detection system and state changing device illustrated in FIG. 1.

FIG. 2 is an expanded block diagram of one embodiment of the logic state detection system 10 and the state changing devices 12 illustrated in FIG. 1. The logic state detection system 10 includes one embodiment of the scanning circuit 14, the data processor 16 and the current detection circuit 18.

The state changing devices 12 may be switch mechanisms, relays, transistors or any other type of devices capable of selectively entering a conducting or non-conducting state. In the illustrated embodiment, the state changing devices 12 are low-side ground referenced state changing devices, each depicted as a switch 22 electrically connected with a ground connection 24. In addition, each of the state changing devices 12 are illustrated as electrically coupled with the scanning circuit 14 by one of a plurality of output lines 26. Multiple state changing devices 12 may be electrically coupled with the scanning circuit 14 by one of the output lines 26. In another embodiment, the state changing devices 12 may be devices capable of selectively entering multiple levels of impedance. The multiple levels of impedance may provide multiple levels of current flow within a conducting state. In yet another embodiment, one of the multiple levels of impedance may provide a non-conducting state.

The scanning circuit 14 includes at least one resistor block 28 and at least one scan block 30. The resistor block 28 is a plurality of discrete components, as later described in detail, electrically connected with the output lines 26. In another embodiment, the resistor block 28 is an integrated circuit or other device(s) with similar functionality to the discrete components. The resistor block 28 is operable to perform low pass filtering and voltage control of signals present on the output lines 26. The output lines 26 also electrically connect the resistor block 28 with the scan block 30.

The scan block 30 may be any device capable of selectively activating one or more of the output lines 26. The scan block 30 is operable to pass externally supplied current to the state changing devices 12. The scan block 30 includes capability for electrical connection with a predetermined number of the output lines 26. As such, additional scan blocks 30 may be added to accommodate additional output lines 26.

In the illustrated embodiment of the scanning circuit 14, two resistor blocks 28 and corresponding scan blocks 30 are depicted. In other embodiments, the scanning circuit 14 may include one resistor block 28 and one scan block 30, or three or more resistor blocks 28 and scan blocks 30 dependent on the number of output lines 26. As later described in detail, any number of the scan blocks 30 may be externally controlled by the data processor 16 using electric signals provided on a data line 32 and a clock line 34. The electric signals on the data line 32 and the clock line 34 are provided to all of the scan blocks 30 in the form of a serial data stream.

Each of the scan blocks 30 may be selectively enabled by an electric signal on a blanking line 36. The blanking line 36 is illustrated as a first blanking line 36A and second blanking line 36B in FIG. 2 to indicate that each of the two scan blocks 30 are exclusively electrically connected with a blanking line 36. As such, the data processor 16 provides separate and distinct electric signals on each one of the blanking lines 36A or 36B to enable and disable one of the scan blocks 30.

The data processor 16 may be a central processing unit, a microprocessor, an electronic control unit, a relay control unit or any other device capable of controlling operation of the logic state detection system 10. In the illustrated embodiment, the data processor 16 includes a memory 40, a first clock 42 and a second clock 44. The data processor 16 also includes other features and devices and may direct the operation of other systems in addition to the logic state detection system 10.

The data processor 16 of this embodiment controls operation of logic state detection system 10 with the data line 32, the clock line 34, the first blanking line 36A and the second blanking line 36B. In addition, the data processor 16 receives electric signals on an input line 46 from the current detection circuit 18. As such, the data processor 16 directs the logic state detection system 10 with four output I/O pins and one input I/O pin. If for example, the number of state changing devices 12 required the use of four scan blocks, six output I/O pins and one input I/O pin would be required to direct the logic state detection system 10.

The memory 40 may include both volatile and non-volatile memory. The memory 40 stores instructions and data used by the data processor 16. The instructions are executed by the data processor 16 for operation, logic state determination and overall control of the logic state detection system 10. The data may be operational data, setpoints, alarm points or any other data stored and used by the data processor 16.

The first and second clocks 42, 44 may be internal to the data processor 16. Alternatively, the clocks 42, 44 may be external clocks in communication with the data processor 16 or a combination of both internal and external clocks. The clocks 42, 44 are used by the data processor 16 to synchronize operation of the logic state detection system 10. In one embodiment, the first clock 42 is a fixed frequency clock operating at high frequency such as, for example, the operating frequency of the data processor 16. The second clock 44 may be a fixed frequency clock where the frequency is determined based on the operating characteristics of the logic state detection system 10. In another embodiment, the second clock 44 may be a variable frequency clock controlled by the data processor 16 as a function of the operating characteristics. Clock signals are generated in the form of a square wave by the first and second clocks 42, 44. The clock signals are selectively output to the scan blocks 30 on the clock line 34.

In one embodiment, the first clock 42 and the second clock 44 are utilized during a setup mode and a scan mode, respectively. During the setup mode, the data processor 16 directs the scan blocks 30 to activate and deactivate all of the output lines 26 as a function of the first clock 42. During the scan mode, the data processor 16 directs the scan blocks 30 to selectively activate the output lines 26 as a function of the second clock 44. Activation and deactivation of the scan blocks 30 is performed by electric signals on the data line 32, the clock line 34 and the blanking line(s) 36. In another embodiment, selected subsets of all the output lines 26 are activated and deactivated during the setup mode and the same subsets are scanned during the scan mode.

The data processor 16 of one embodiment operates the logic state detection system 10 in an active mode and during a sleep mode. The sleep mode is a power saving mode where the data processor 16 deactivates the logic state detection system 10. In addition, the data processor 16 self-deactivates and then reactivates itself and the logic state detection system 10 on a predetermined schedule to determine if a return to the active mode is warranted. Within the active mode, the data processor 16 may perform many functions during the setup mode in addition to directing operation of the logic state detection system 10. Conversely, during reactivation within the sleep mode, the data processor 16 may perform few or no functions in addition to directing the logic state detection system 10. During reactivation as well as during the active mode, the data processor 16 enters the scan mode and the setup mode to direct the scan blocks 30 and receive electric signals from the current detection circuit 18.

The current detection circuit 18 may be any device capable of monitoring varying levels of current flow and providing electric signals indicative of current flow. The embodiment of the current detection circuit 18 illustrated in FIG. 2 includes a current management circuit 52 and an output driver circuit 54. The current management circuit 52 provides current to the scan blocks 30 on a $V_{BB}$ line 56. In addition, the current management circuit 52 monitors the current level to determine if the output lines 26 activated by the scan blocks 30 include state changing devices 12 that are conducting or non-conducting.

The output driver circuit 54 indicates the logic state of the state changing device(s) 12 on the activated output lines 26. Indication by the output driver circuit 54 is a function of the monitoring performed by the current management circuit 52. The output driver circuit 54 provides electric signals to the data processor 16 on the input line 46.

During operation, the data processor 16 enters the scan mode and directs one of the scan blocks 30 to activate one of the output lines 26 using the data line 32, the clock line 34 and the blanking line 36. The current management circuit 52 provides current on the $V_{BB}$ line 56 that passes to the activated output line 26 through the corresponding scan block 30. The current on the activated output line 26 is low pass filtered and voltage controlled by the resistor block 28. The current management circuit 52 detects the magnitude of the current flowing to the activated output line 26. The output driver circuit 54 provides an electric signal to the data processor 16 indicative of the logic state of the corresponding state changing device(s) 12 on the activated output line 26 as a function of the current flow. The processor 12 directs the scan blocks 30 to sequentially activate each of the output lines 26 until the logic state of all, or a subset of the state changing devices 12 is determined.

The data processor 16 also enters the setup mode during operation. Within the setup mode, the data processor 16 performs processing based on the logic state of the state changing devices 12. In addition, the data processor 16 initializes the scanning circuit 14. Initialization of the scanning circuit 14 is performed to setup the scanning circuit 14 for the next scan mode as will be later described.

Figure 3:
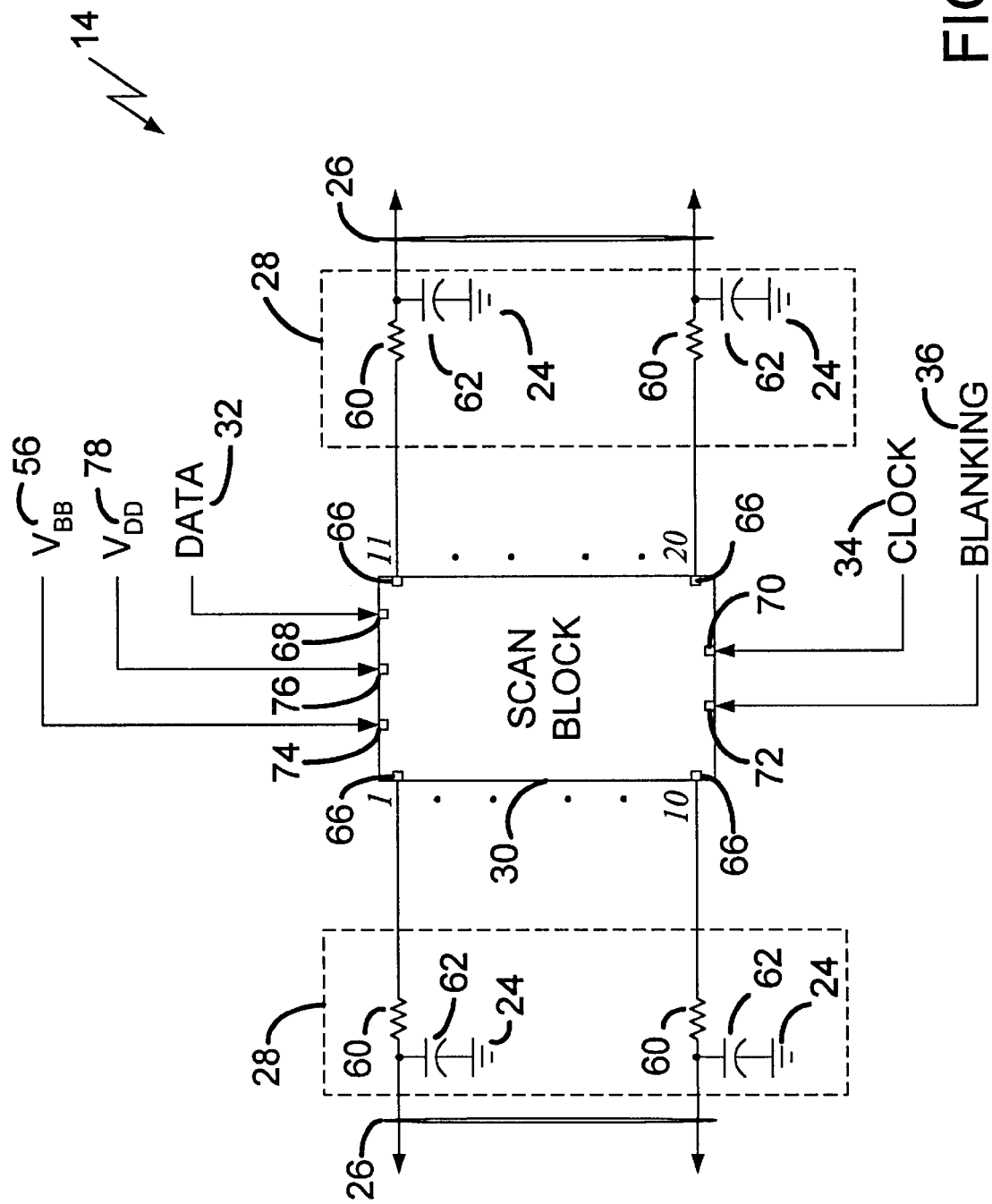
FIG. 3 is a schematic diagram of one embodiment of a scanning circuit that forms a portion of the logic state detection system of FIG. 2.

FIG. 3 is a circuit schematic of the scanning circuit 14 illustrating one embodiment of the resistor block 28 and the scan block 30. The resistor block 28 includes a plurality of resistors 60 and a plurality of capacitors 62. Each of the resistors 60 are serially connected in the output lines 26 between the scan block 30 and the state changing devices 12 (FIG. 2) to control current flow. Each of the capacitors 62 forms a connection between the output lines 26 and the ground connection 24. The capacitors 62 are electrically connected with the output lines 26 between the resistors 60 and the state changing devices 12.

The resistor block 28 operates as a low pass filter with the RC network formed by the combination of the resistors 60 and the capacitors 62 on each of the output lines 26. The low pass filter minimizes electromagnetic interference, electrostatic discharge, transients and other undesirable interference that may be present on the output lines 26. The output lines 26 may receive electromagnetic interference from sources of electromagnetic radiation external to the logic state detection system 10, such as, for example, cell phones, radio transmitters, computing devices, electrical noise and lightning. In addition, the outputs lines 26 may act as a source of electromagnetic energy due to the activation and deactivation by the scan block 30. Further, potentially damaging levels of electrostatic discharge and other transient voltages may be introduced to the logic state detection system 10. In other embodiments, the resistor block 28 may include other/additional techniques for eliminating undesirable transients, such as, for example, shielding, high pass filtering or any other type of technique for minimizing interference and overvoltage conditions.

The scan block 30 of this embodiment may be any device capable of time based operation to selectively activate a plurality of outputs to pass current at the direction of the data processor 16. The exemplary device illustrated is part number A6812EEP manufactured by Allegro Inc. of Worcester, Mass. The scan block 30 includes a plurality of output ports 66 each electrically connected with one of the output lines 26. The illustrated embodiment includes twenty output ports 66. In addition, the scan block 30 includes a data port 68, a clock port 70, a blanking port 72 and a $V_{BB}$ connection 74 electrically connected with the data line 32, the clock line 34, the blanking line 36 and the $V_{BB}$ line 56, respectively. Power to operate the scan block 30 is supplied to a $V_{DD}$ connection 76 with a $V_{DD}$ line 78.

The scan block 30 operates in a shift register fashion as a function of signals provided to the data port 68 and the clock port 70. The signals are formatted as a serial data stream of digital inputs representing either a "logic one" condition or a "logic zero" condition. In addition, signals provided to the blanking port 72 enable the operation of the scan block 30. The signals provided to the blanking port 72 are digital signals representing a logic one state when the scan block 30 is enabled and a logic zero state when the scan block 30 is disabled. As such, multiple scan blocks 30 as illustrated in FIG. 2 may be operated with common signals on the data port 68 and the clock port 70 as previously discussed.

During operation, the serial data stream present on the data port 68 is latched or clocked into the scan block 30 each time the clock port 70 is toggled from the logic zero state to the logic one state while the blanking port 72 is in a logic one state. The signal present at the data port 68 is stored in a first register corresponding to a first one of the output ports 66 when the clock port 70 toggles to the logic one state. When the clock port 70 again toggles to the logic one state, the data on the data port 68 is stored in the first register and the data previously stored in the first register is shifted to a second register corresponding to a second one of the output ports 66. Continuing this process, a logic state is sequentially loaded or clocked into each of the registers corresponding to each of the output ports 66 by shifting the data provided in the serial datastream through the scan block 30.

The output ports 66 are activated by a logic one state stored in the corresponding register. Conversely, a logic zero state deactivates the corresponding output port 66. Activation of one of the output ports 66 activates one the output lines 26 electrically connected thereto. As such, the output lines 26 may be sequentially activated until all, or a subset of the output lines 26 on one of the scan blocks 28 are activated. For example, all the output lines 26 are activated by a serial data stream of logic level one signals supplied to the data port 68 while toggling the clock port 70 between a logic one state and a logic zero state. In addition, the output lines 26 may be sequentially activated and deactivated such that one or more of the output lines 26 may be activated at any given time. Upon activation of the one or more of the output lines 26, the scan block 30 passes current from the current detection circuit 18 to the activated output lines 26.

In the presently preferred embodiments, the change in the magnitude of the current passed to one of the output lines 26 during the scan mode is maintained at relatively low magnitude by the resistor 60. It is desirable to minimize the difference in current magnitude when a deactivated output line 26 is activated. Minimization of the change in magnitude of the current minimizes electromagnetic interference and other transients related to activating and deactivating the output lines 26. Due to the capacitors 62, the current levels passed to the output lines 26 can include charging current for the capacitors 62. Initializing the scanning circuit 14 during the setup mode minimizes the charging current.

During the setup mode, the clock port 70 is supplied a high frequency clock pulse from the first clock 42 (FIG. 2). In addition, the serial data stream provided to the data port 68 is logic one level signals to activate all of the output ports 66. As a result, the capacitors 62 on the corresponding output lines 26 are each supplied current and reach a charged state. Prior to the conclusion of the setup mode, the serial data stream provided to the data port 68 is changed to logic zero level signals long enough to deactivate all the corresponding output lines 26.

Upon entry into the scan mode, the capacitors 62 are fully charged or are partially discharged. As such, the magnitude of current passed through the scan block 30 when one of the output lines 26 is activated is mainly due to the logic state of the state changing devices 12. By minimizing the current drawn by the capacitors 62, the difference in current magnitude when one of the state changing devices 12 is conducting and non-conducting may be small and yet still indicate the logic state to the current detection circuit 18.

Figure 4:
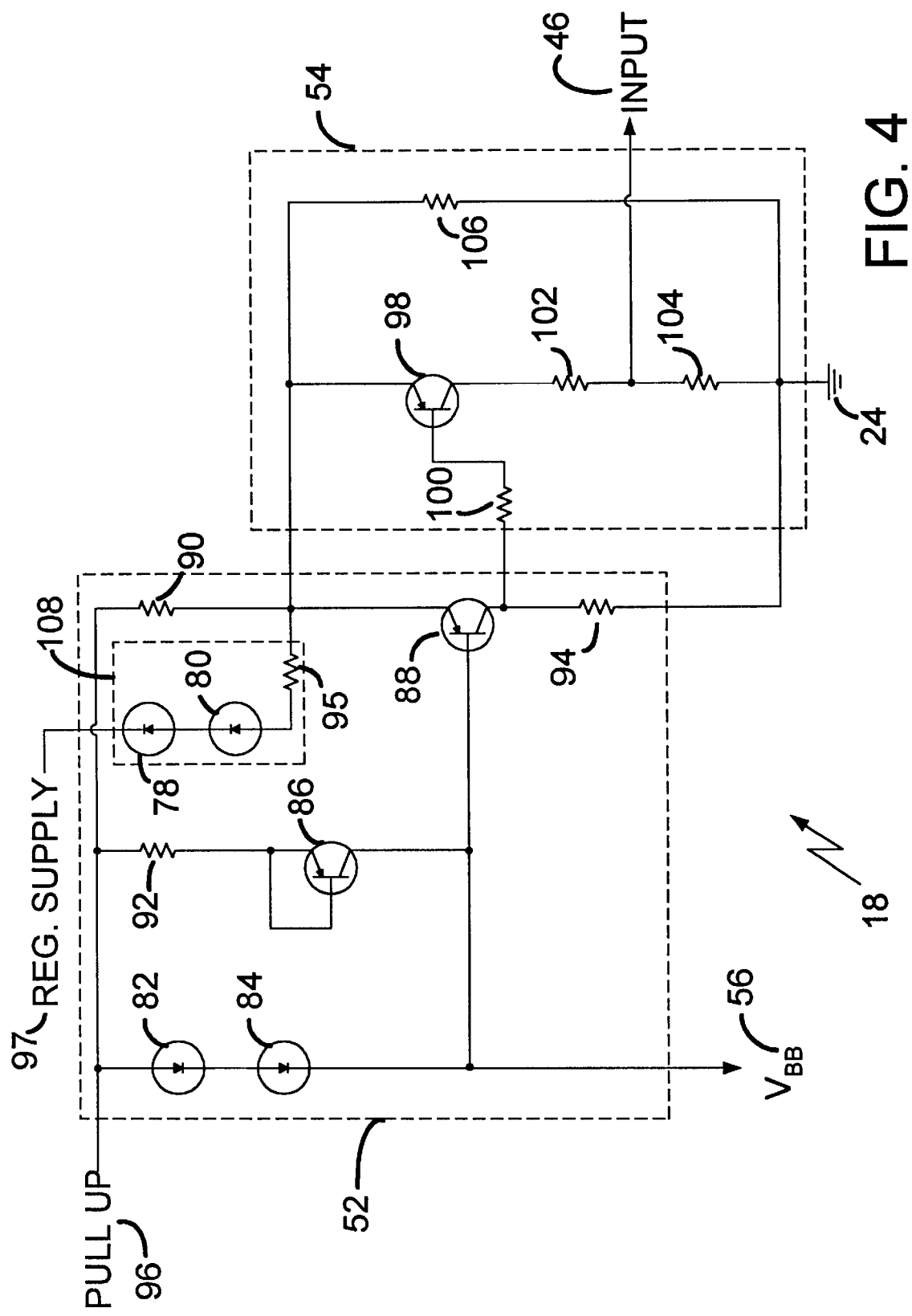
FIG. 4 is a schematic diagram of one embodiment of a current detection circuit that forms a portion of the logic state detection system of FIG. 2.

FIG. 4 is a circuit schematic of one embodiment of the current detection circuit 18 illustrated in FIG. 2 that includes the current management circuit 52 and the output driver circuit 54. The illustrated embodiment of the current management circuit 52 includes a first diode 78, a second diode 80, a third diode 82, a fourth diode 84, a first transistor 86, a second transistor 88, a first resistor 90, a second resistor 92, a third resistor 94 and a fourth resistor 95 electrically connected as illustrated. In addition, the current management circuit 52 is electrically connected with the ground connection 24, the $V_{BB}$ line 56, a pull-up line 96 and a regulated supply line 97. In the presently preferred embodiment, the first and second transistors 86, 88 are bipolar junction transistors (BJTs). In addition, the pull-up line 96 and the regulated supply line 97 are electrically connected with a 10 volt power supply and a 5 volt regulated power supply, respectively. In alternative embodiments, other types of transistors (or other similar devices) and voltage levels may be used to achieve similar functionality.

The current management circuit 52 provides current to the scan block 30 on the $V_{BB}$ line 56 during both the scan mode and the setup mode. Current is supplied via the pull-up line 96 using the third and fourth diodes 82, 84 and the first and second transistors 86, 88. The third and fourth diodes 82, 84 allow high magnitude current flow during the setup mode thereby avoiding stress of the first and second transistors 86, 88. In addition, the current management circuit 52 directs the output driver circuit 54 to indicate current levels less than or greater than a threshold current level.

The illustrated embodiment of the output driver circuit 54 includes a third transistor 98, a fifth resistor 100, a sixth resistor 102, a seventh resistor 104 and an eighth resistor 106 electrically connected as illustrated. The output driver circuit 54 is also electrically connected with the ground connection 24 and the input line 46. The output driver circuit 54 provides electric signals on the input line 46 as a function of current flowing through the seventh resistor 104. The fifth, sixth and eighth resistors 100, 102 and 106 regulate the current within the output driver circuit 54. Current flow through the seventh resistor 104 occurs when the third transistor 98 is activated. In the illustrated embodiment, the third transistor 98 is a BJT, however, other transistors or devices may be used to achieve similar functionality.

Activation of the third transistor 98 occurs when the second transistor 88 is deactivated. Activation and deactivation of the second transistor 88 is a function of the magnitude of current flowing on the $V_{BB}$ line 56. The threshold current level determines the magnitude of current flowing on the $V_{BB}$ line 56 that activates and deactivates the second transistor 88.

The threshold current level is determined based on a ratio between the resistive value of the first resistor 90 and the second resistor 92. The ratio sets the threshold current level as a function of operative cooperation of the first and second transistors 86, 88. The first transistor 86 functionally operates as a diode with relatively low current flow due to the second resistor 92. As such, the first transistor 86 provides voltage at the base of the second transistor 88 that, in combination with the current provided through the first resistor 90, activates and deactivates the second transistor 88.

Cooperative operation of the first and second transistors 86, 88 provides temperature compensation of the threshold current. The first and second transistors 86, 88 are formed in the same silicon to provide temperature related operation that is almost identical. In other embodiments, other types of temperature compensation schemes may be used to provide similar operation.

An automatic gain control circuit 108 formed by cooperative operation of the first diode 78, the second diode 80 and the fourth resistor 95 performs voltage compensation to maintain the threshold current level. The automatic gain control circuit 108 operates to increased current flow through the first resistor 90 during an increase in voltage on the pull-up line 86. The current flow through the first resistor 90 is determined as a function of the second transistor 88 and the automatic gain control circuit 108.

The automatic gain control circuit 108 operates to shunt current to the regulated supply line 97 as a function of the difference in magnitude of voltage on the pull-up line 96 and the regulated supply line 97. The first and second diodes 78, 80 and the fourth resistor 95 control the current flow to the regulated supply line 97. In the presently preferred embodiment, the voltage on the pull-up line 96 may fluctuate down to the level of the voltage on the regulated supply line 97 without significantly affecting the threshold current level due to corresponding adjustment of the current flow to the regulated supply line 97.

As the voltage on the pull-up line 96 decrease (e.g. becomes closer to the magnitude of the voltage on the regulated supply line 97), the amount of current flowing through the first resistor 90, the first and second diodes 78, 80 and the fourth resistor 95 correspondingly decreases. Conversely, increases in the voltage on the pull-up line 96 increase the current flow. Accordingly, the voltage drop of the first resistor 90 is maintained at a relatively constant value as the voltage on pull-up line 96 varies. In addition, the ratio is further insulated from changes due to voltage variation of the pull-up line 96 since the first and second transistors 86, 88 are both electrically connected with the pull-up line 96.

During operation, the second transistor 88 is activated and the third transistor 98 is deactivated when the current flow on the $V_{BB}$ line 56 is above the threshold current level. The resulting electric signal provided on the input line 46 is a logic zero level signal. Conversely, when the current flow is less than the threshold current level, the second transistor 88 is deactivated and the third transistor 98 is activated resulting in a logic one level signal on the input line 46. As such, a logic zero level signal indicates the state changing device(s) 12 are conducting and a logic one level signal indicates the state changing device(s) 12 are non-conducting. In other embodiments, other combinations of indications may be provided the logic level signals.

In another embodiment, the regulated supply line 97 may be electrically connected with a variable voltage power supply. The voltage output of the variable voltage power supply is controlled by the data processor 16. In this embodiment, the voltage on the regulated supply line 97 may be adjusted with respect to the voltage on the pull-up line 96 to vary the threshold current level.

During the scan mode, the data processor 16 may selectively vary the threshold current level to adjust the detection capability of the current detection circuit 18. The threshold current may be adjusted as a function of the anticipated current flow on one of the activated outputs lines 26. The anticipated current flow is that magnitude of current sensed by the current detection circuit 18 indicating the logic state of corresponding state changing device(s) 12. The logic state detection system 10 of this embodiment may determine the logic state of state changing devices 12 with multiple levels of impedance corresponding to multiple levels of current flow.

Figure 5:
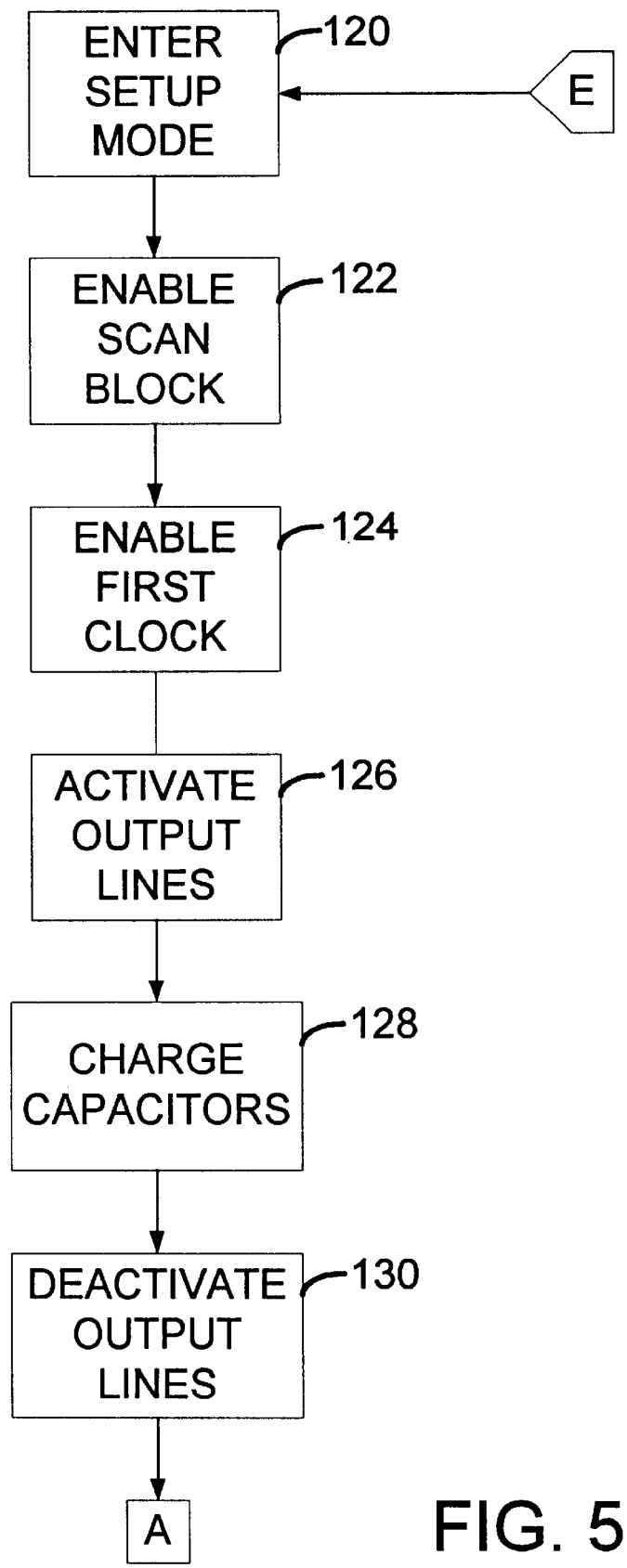
FIG. 5 is a first part of a flow diagram illustrating operation of the logic state detection system illustrated in FIG. 1.

FIG. 5 is a flow chart illustrating a method of operation of one embodiment of the logic state detection system 10 that will be discussed with reference to FIGS. 1, 2, 3 and 4. During operation, the data processor 16 may enter the setup mode at block 120. At block 122, the data processor 16 provides logic one level signals on all the blanking lines 36A and 36B to enable the scan blocks 30. The data processor 16 enables the first clock 42 to output electric signals to the scan blocks 30 on the clock line 34 at block 124. At block 126, a serial data stream of logic one level signals are clocked into the scan blocks 30 to activate all of the output lines 26.

Following activation, current supplied with the current management circuit 52 is passed through the scan blocks 30 to charge the capacitors 62 at block 128. At block 130, the capacitors 62 are fully charged and the data processor 16 clocks a serial data stream of logic zero level signals into the scan blocks 30 to deactivate the output lines 26.

Figure 6:
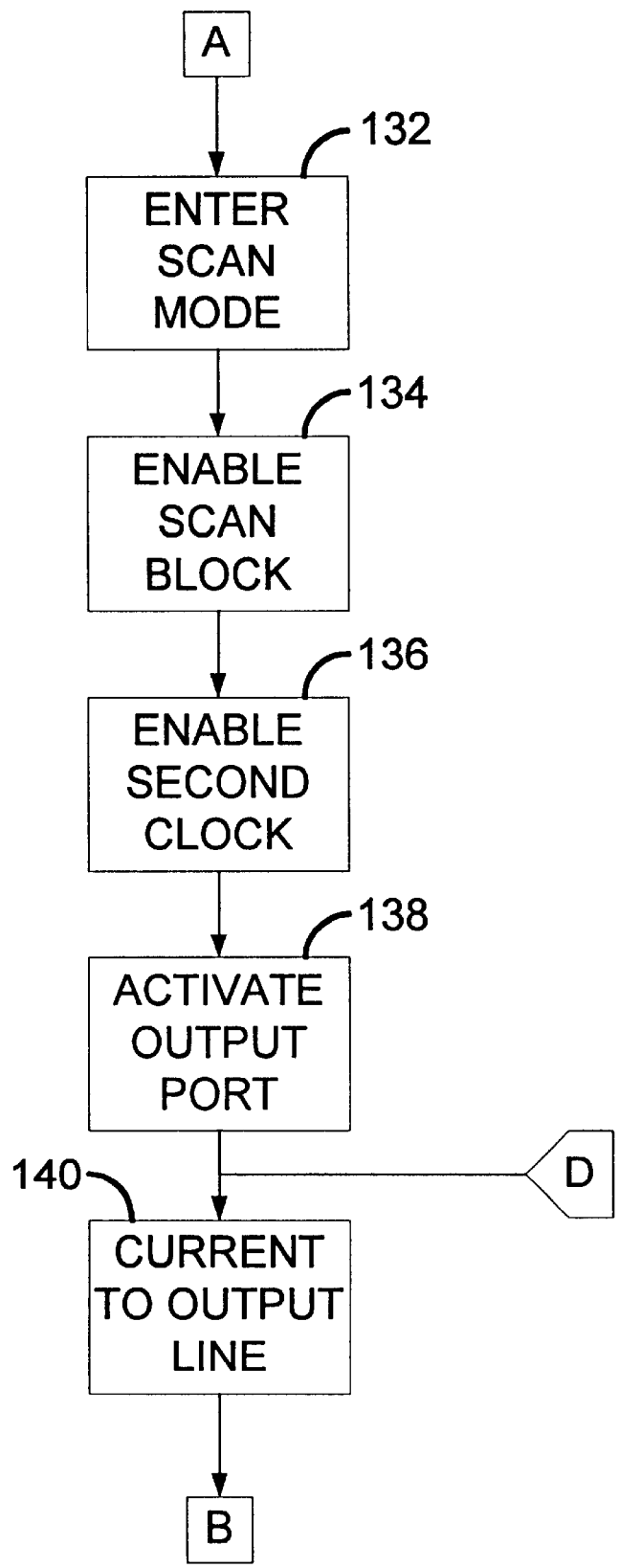
FIG. 6 is a second part of the flow diagram of FIG. 5.

Referring now to FIG. 6, the data processor 16 enters the scan mode at block 132. At block 134, the data processor 16 provides a logic one level signal on one of the blanking lines 36A or 36B and a logic zero level signal on the other blanking line 36A, 36B to enable only one of the scan blocks 30. The data processor 16 utilizes the second clock 44 to output electric signals to the scan blocks 30 on the clock line 34 at block 136. At block 138, a logic one level signal is provided to the scan blocks 30 on the data line 32 to activate one of the output ports 66 on the enabled scan block 30. Current flows on the $V_{BB}$ line 56 to one of the output lines 26 corresponding to the activated output port 66 at block 140.

Figure 7:
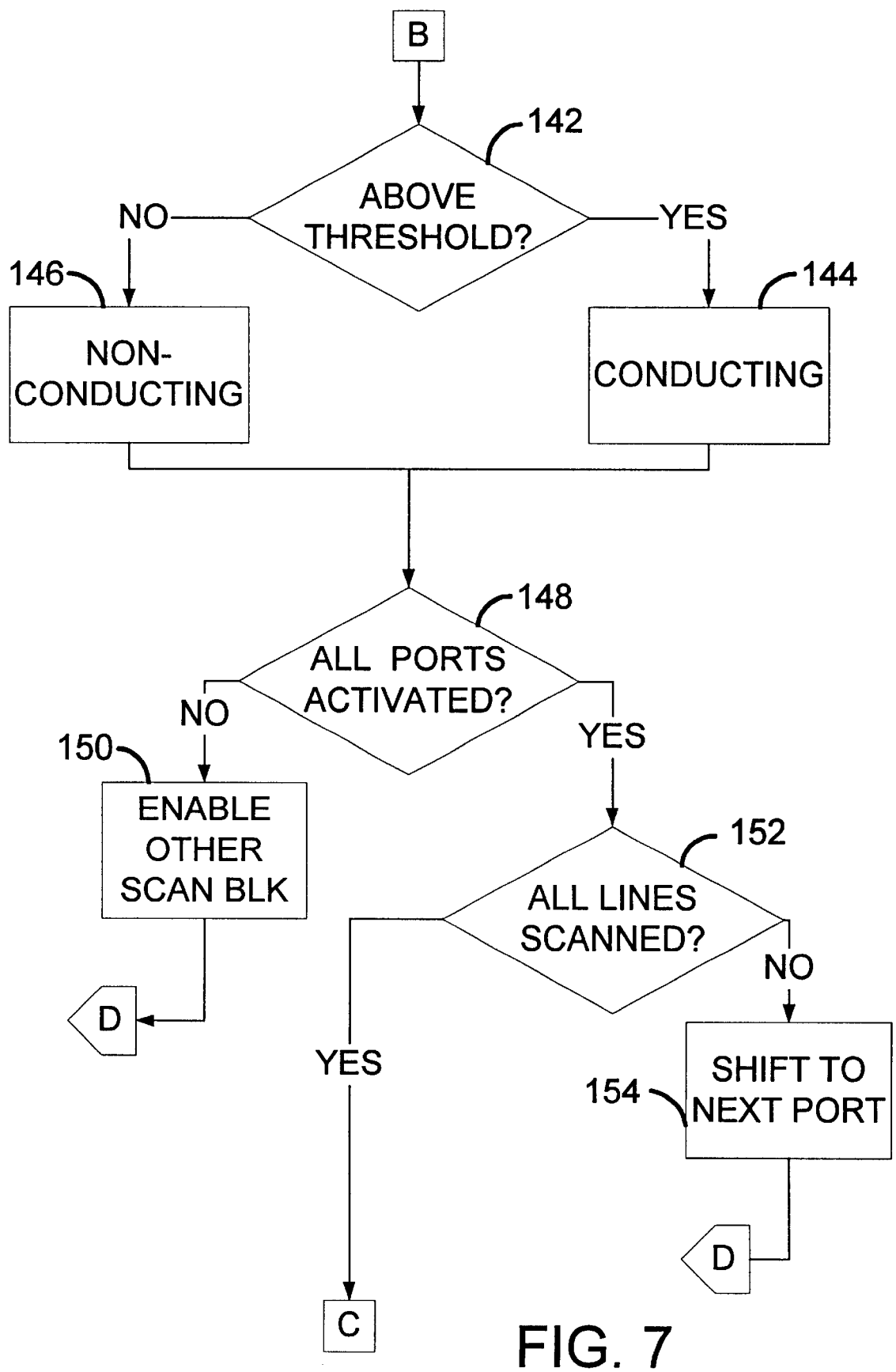
FIG. 7 is a third part of the flow diagram of FIG. 5.

Referring now to FIG. 7, at block 142, the current management circuit 52 determines if the current is above the threshold current level. If yes, at block 144 the output current driver circuit 54 indicates to the data processor 16 that the state changing device(s) 12 on the activated output line 26 is conducting. If no, the state changing device(s) 12 is indicated as non-conducting at block 146.

At block 148, the data processor 16 determines if the output port 66 on the disabled scan block 30 has been previously activated during this scan mode to obtain the logic state of the corresponding state changing device(s) 12. If not, at block 150, the data processor 16 provides a logic one level signal on one of the blanking lines 36A or 36B and a logic zero level signal on the other blanking line 36A, 36B to switch the enablement of the scan blocks 30. As a result, the enabled scan block 30 activates the same output port 66 previously activated on the other scan block 30 and returns to block 140 to detect the logic state.

If at block 148 the corresponding output ports 66 on each of the scan blocks 30 have been activated, the data processor 16 determines if all, or the desired subset of the output lines 26 on all the scan blocks 30 have been scanned at block 152. If no, at block 154, the data processor 16 deactivates the currently activated output port 66, activates the next output port 66 and returns to block 140 to repeat the detection process.

Figure 8:
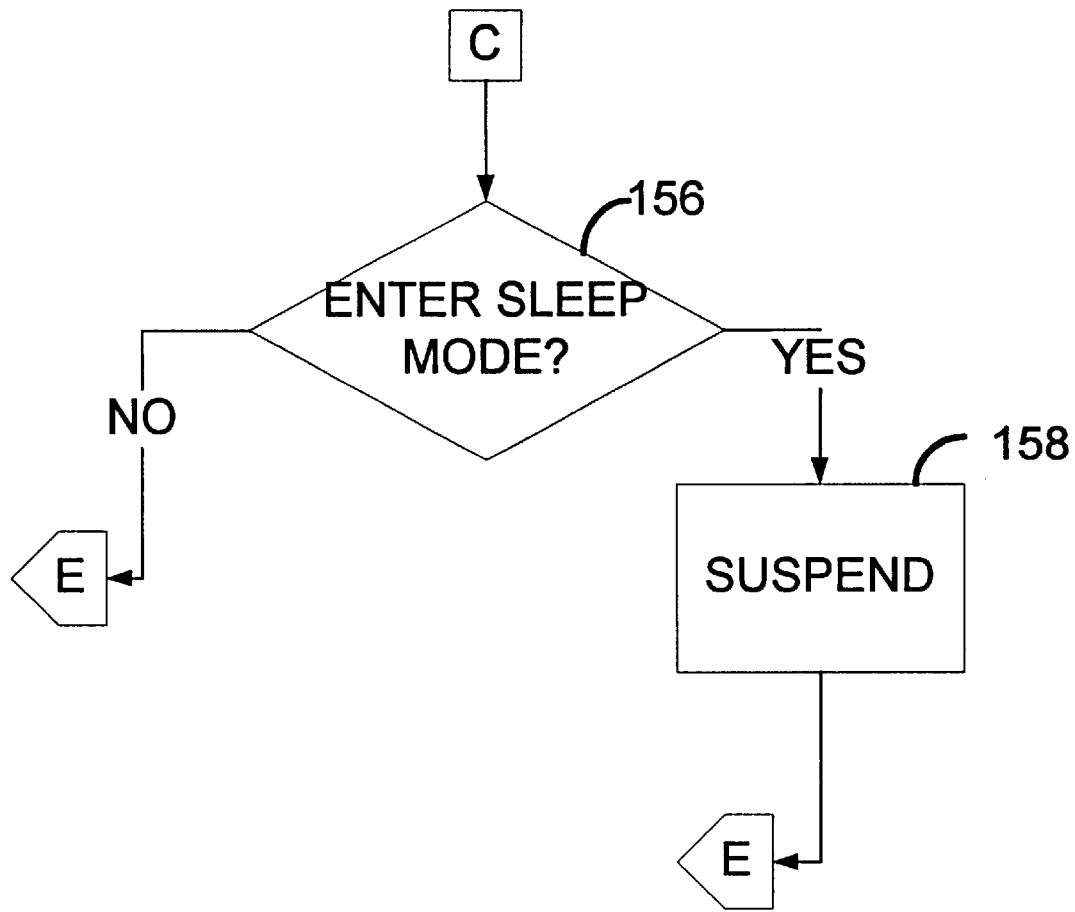
FIG. 8 is a fourth part of the flow diagram of FIG. 5.

Referring now to FIG. 8, if the scan mode is complete at block 152, the data processor 16 decides whether to enter the sleep mode at block 156. If the data processor 16 decides to enter the sleep mode, operation is suspended for a period of time at block 158. Following the period of time, the data processor 16 returns to block 120 and the detection process repeats. If the data processor 16 decides not to enter the sleep mode at block 156, the data processor 16 returns to block 120 and the detection process repeats.

Figure 9:
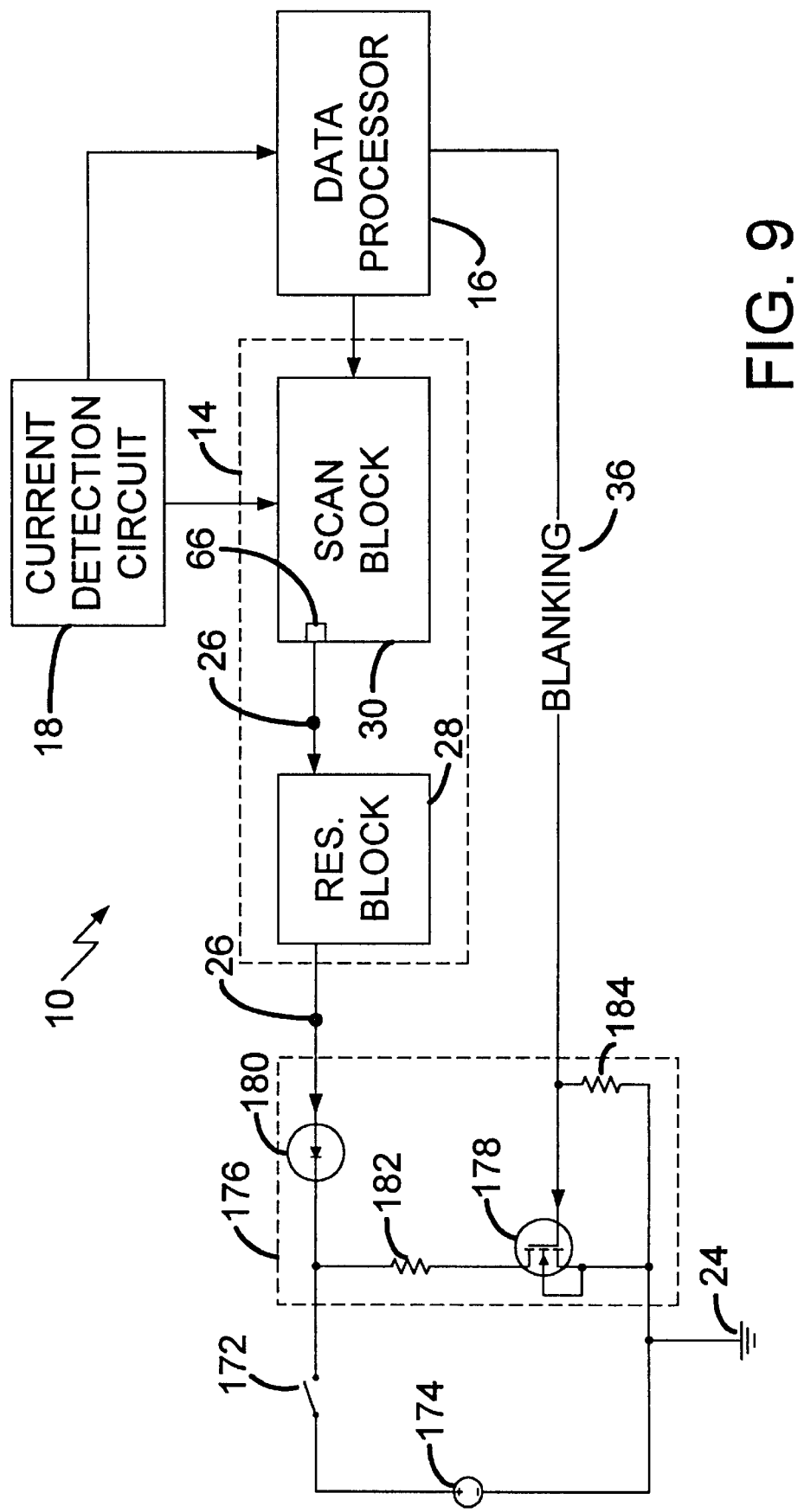
FIG. 9 illustrates another embodiment of the logic state detection system and the at least one state changing device illustrated in FIG. 1.

FIG. 9 illustrates the state changing devices 12 and another embodiment of the logic state detection system 10 that includes the scanning circuit 14, the data processor 16 and the current detection circuit 18. In this embodiment, the state changing devices 12 are high-side state changing devices depicted as a switch 172 electrically connected with a power supply 174. It should be noted that although only one state changing device 12 is illustrated in FIG. 9, a plurality of state changing devices 12 may be present similar to the previously disclosed embodiments. The state changing devices 12 are also electrically connected with the scanning circuit 14 by the output lines 26.

The scanning circuit 14 of this embodiment includes the resistor block 28, the scan block 30 and at least one high side interface circuit 176 electrically connected as illustrated. The resistor block 28, the scan block 30 as well as the data processor 16 and the current detection circuit 18 are similar in operation and configuration to the previously disclosed embodiments.

One embodiment of the high side interface circuit 176 includes a first transistor 178, a diode 180, a first resistor 182 and a second resistor 184 electrically connected as illustrated in FIG. 9. In addition, the high side interface circuit 176 is electrically connected with the ground connection 24, the blanking line 36 and one of the output lines 26. The high side interface circuit 178 may be included on each of the output lines 26 of the logic state detection system 10 of this embodiment.

The blanking line 36 controls activation of the first transistor 178 as well as enablement of the scan block 30 as previously discussed. The first transistor 178 is depicted in FIG. 9 as a MOSFET transistor, however other transistors or similar components may be used to achieve similar functionality. When activated, the first transistor 178 provides a current path to the ground connection 24. When deactivated, the first transistor 178 reduces the quiescent operating current passing through the first resistor 182 when the logic state detection system 10 is not operating.

The overall operation of the logic state detection system 10 is similar to the previously discussed embodiments. For purposes of brevity the previous discussion will not be repeated. Instead, the discussion will focus on differences in operation of this embodiment.

During operation in the scan mode, when the scan block 30 is enabled by an electric signal on the blanking line 36, the first transistor 178 is activated. When one of the output lines 26 are activated by the scan block 30 and the corresponding state changing device(s) 12 is non-conducting, a low impedance path to the ground connection 24 is detected by the current detection circuit 18. As such, the current detection circuit 18 provides a logic zero level signal to the data processor 16. When the corresponding state changing device 12 is conducting, the diode 180 limits the current flow through the scan block 30 and the current detection circuit 18 provides a logic one level signal to the data processor 16. As such, a logic one level signal indicates a conducting state changing device(s) 12 and a logic zero level signal indicates a non-conducting state changing device(s) 12.

The previously discussed embodiments of the logic state detection system 10 are a volume efficient means to detect the logic state of any number of state changing devices 12. The logic state detection system 10 allows a high level of integration to cut down on packaging volume. Reduction in the instruction sets and I/O pin counts of the data processor 16 is also achieved by operating the scan blocks 30 in parrallel. In addition, protection against transients and overvoltage conditions as well as minimization of EMI is achieved through the use of low current levels and the resistor block 28. Further, expandibility of the logic state detection system 10 to detect large numbers of state changing devices is relatively easy and efficient with minimal increases in I/O pin count and instruction sets.

While the invention has been described above by reference to various embodiments, it will be understood that many changes and modifications can be made without departing from the scope of the invention. It is therefore intended that the foregoing detailed description be understood as an illustration of the presently preferred embodiments of the invention, and not as a definition of the invention. It is only the following claims, including all equivalents that are intended to define the scope of this invention.

What is claimed is:

1. A logic state detection system for detecting the logic state of state changing devices, the logic state detection system comprising:

at least one state changing device; and a current detection circuit electrically coupled with the at least one state changing device, the current detection circuit operable to provide current and identify the logic state of the at least one state changing device as a function of a threshold current level wherein the current detection circuit comprises an automatic gain control circuit operable to perform voltage compensation to maintain the threshold current level as voltage supplying the current detection circuit varies.

2. The logic state detection system of claim 1, wherein the threshold current level is a magnitude of current that minimizes electromagnetic interference and is indicative of the logic state of the at least one state changing device.

3. The logic state detection system of claim 1, wherein the current detection circuit comprises the automatic gain control circuit, the automatic gain control circuit operable to adjust the threshold current level as a function of a magnitude of current indicative of the logic state of the at least one state changing device.

4. The logic state detection system of claim 1, wherein the threshold current level is temperature compensated.

5. The logic state detection system of claim 1, further comprising a scan block electrically connected with the at least one state changing device, the scan block operable to selectively pass current supplied by the current detection circuit to the at least one state changing device.

6. The logic state detection system of claim 1, further comprising a data processor electrically coupled with the current detection circuit, the data processor operable to adjust the threshold current level as a function of the anticipated magnitude of current provided by the current detection circuit indicative of the logic state of the at least one state changing device.

7. A logic state detection system for detecting the logic state of state changing devices, the logic state detection system comprising:

a scan block electrically coupled with at least one state changing device, the scan block operable to selectively pass current to the at least one state changing device; and a current detection circuit electrically coupled with the scan block the current detection circuit operable to identify the logic state of the at least one state changing device as a function of the current wherein the current detection circuit comprises a current management circuit and an output driver circuit, the current management circuit operable to provide current to the scan block and monitor the magnitude of current provided.

8. The logic state detection system of claim 7, further comprising a resistor block electrically connected with the scan block and the at least one state changing device, the resistor block operable as a low pass filter.

9. The logic state detection system of claim 8, wherein the resistor block comprises at least one resistor and at least one capacitor.

10. The logic state detection system of claim 7, further comprising a data processor electrically connected with the current detection circuit and the scan block, the data processor operable to direct the scan block to selectively pass current, the data processor also operable to receive indication of the logic state of the at least one state changing device from the current detection circuit.

11. The logic state detection system of claim 10, wherein the data processor comprises a first clock and a second clock, the first clock operable during a setup mode, the second clock operable during a scan mode.

12. The logic state detection system of claim 7, wherein the at least one state changing device is electrically connected between the scan block and a ground connection.

13. A logic state detection system for detecting the logic state of state changing devices, the logic state detection system comprising:
    a scanning circuit comprising a plurality of output ports each electrically coupled with a state changing device, the output ports selectively activated during one of a setup mode and a scan mode; and
    a current detection circuit electrically coupled with the scanning circuit, the current detection circuit operable to supply current through the output ports during the setup mode and through selectively activated output ports during the scan mode, the current detection circuit operable to provide indication of the logic state of the state changing device as a function of the current during the scan mode.

14. The logic state detection system of claim 13, wherein the scanning circuit comprises a plurality of scan blocks, each of the scan blocks responsive to a serial data stream and an enabling signal to selectively activate the output ports, the serial data stream provided to all the scan blocks and the enabling signal provided exclusively to each of the scan blocks.

15. The logic state detection system of claim 13, wherein current supplied by the current detection circuit during the setup mode is operable to charge a plurality of capacitors electrically coupled with the output ports.

16. The logic state detection system of claim 13, further comprising a data processor electrically coupled with the scanning circuit and the current detection circuit, the data processor operable during the scan mode to obtain the logic state of a plurality of state changing devices as a function of sequential activation and deactivation of each of the output ports.

17. The logic state detection system of claim 16, wherein the data processor comprises a first clock and a second clock, the first clock operable during the setup mode and the second clock operable during the scan mode.

18. The logic state detection system of claim 13, wherein the scanning circuit is operable to sequentially activate all the output ports and then sequentially deactivate all the output ports as a function of a first clock.

19. The logic state detection system of claim 13, wherein the scanning circuit is operable to activate and then deactivate each of the output ports in sequence as a function of a second clock.

20. The logic state detection system of claim 13, wherein the scanning circuit comprises at least two scan blocks, the scan blocks operable in parallel with the current detection circuit.

21. The logic state detection system of claim 13, wherein the scan blocks are selectively disabled as a function of selective activation of the output ports.

22. The logic state detection system of claim 13, wherein the state changing devices are low side ground referenced state changing devices.

23. The logic state detection system of claim 13, wherein the state changing devices are high side state changing devices and the scanning circuit comprises a high side interface circuit electrically connected with the state changing devices.

24. The logic state detection system of claim 13, wherein the scanning circuit comprises a resistor block electrically coupled with each of the output ports, the resistor block operable to limit the current and minimize electromagnetic interference and electrostatic discharge.

25. A logic state detection system for detecting the logic state of a plurality of state changing devices, the logic state detection system comprising:
    a plurality of scan blocks electrically coupled with the state changing devices, wherein the scan blocks are operable to selectively pass current to at least one of the state changing devices;
    a data processor electrically coupled with the scan blocks, the data processor operable to selectively direct the scan blocks with a serial data stream by selective enablement of each of the scan blocks;
    a current detection circuit electrically coupled with the scan blocks and the first data processor, the current detection circuit operable to monitor the current passed by the scan blocks and indicate the logic state of the state changing devices as a function of a threshold current level; and
    a high side interface circuit electrically connected with the scan blocks and the state changing devices, wherein the high side interface device is operable to provide an interface for state changing devices configured as high side state changing devices.

26. The logic state detection system of claim 25, further comprising a resistor block electrically connected with the scan blocks and the state changing devices, wherein the resistor block is operable as a low pass filter.

27. The logic state detection system of claim 25, wherein the state changing devices are operable to selectively assume at least two impedance levels, the data processor operable to modify the threshold current level as a function of current indicative of one of the impedance levels.

28. The logic state detection system of claim 25, wherein the current detection circuit comprises a current management circuit and an output driver circuit.

29. The logic state detection system of claim 28, wherein the current management circuit is operable to differentiate between a non-conducting state changing device and a conducting state changing device.

30. The logic state detection system of claim 28, wherein the output driver circuit is operable to generate signals provided to the data processor indicative of a non-conducting state changing device and a conducting state changing device.

31. A method of determining the logic state of a plurality of state changing devices, the method comprising:
    selectively activating one of a plurality of output lines, the output lines each electrically connected with at least one of the state changing devices;

passing current to the activated one of the output lines; and indicating the logic state of the at least one of the state changing devices as a function of the current entering a setup mode;

activating all of the output lines;

passing current to the output lines to charge a plurality of capacitors; and deactivating all the output lines.

32. The method of claim 31, further comprising the initial act of entering a scan mode.

33. The method of claim 31, wherein selectively activating one of the output lines comprises:

transmitting a serial data stream to a plurality of scan blocks;

transmitting an enabling signal to one of the scan blocks; and responding to the serial data stream with one of the scan blocks as a function of the enabling signal.

34. The method of claim 31, wherein passing current to the activated one of the output lines comprises maintaining current flow that minimizes electromagnetic interference.

35. The method of claim 31, wherein indicating the logic state of the one of the state changing devices comprises:

monitoring the current magnitude; and providing a signal indicative of the current magnitude with respect to a threshold current level.

36. The method of claim 31, wherein indicating the logic state of the one of the state changing devices comprises temperature compensating to accurately monitor the current.

37. The method of claim 31, wherein indicating the logic state of the one of the state changing devices comprises voltage compensating to accurately monitor the current.

38. The method of claim 31, wherein indicating the logic state of the one of the state changing devices comprises selecting a threshold current level as a function of the anticipated current indicative of the logic state of the at least one state changing device.

39. A method of determining the logic state of a plurality of state changing devices, the method comprising:

selectively activating one of a plurality of output lines, the output lines each electrically connected with at least one of the state changing devices passing current to the activated one of the output lines;

indicating the logic state of the at least one of the state changing devices as a function of the current;

transmitting a serial data stream to a plurality of scan blocks;

transmitting an enabling signal to one of the scan blocks; and responding to the serial data stream with one of the scan blocks as a function of the enabling signal.

* * * * *

UNITED STATES PATENT AND TRADEMARK OFFICE
CERTIFICATE OF CORRECTION

PATENT NO. : 6,791,479 B2
DATED : September 14, 2004
INVENTOR(S) : Richard Alen Kraus et al.

It is certified that error appears in the above-identified patent and that said Letters Patent is hereby corrected as shown below:

Column 15,
Lines 1-2, delete "lines; and" and substitute -- lines; -- in its place.

Column 16,
Line 17, after "changing devices" insert -- ; -- (semicolon).
Line 17, start a new paragraph with the words "passing current to the".

Signed and Sealed this

Eighth Day of February, 2005

JON W. DUDAS
*Director of the United States Patent and Trademark Office*